(12) United States Patent
Otsuki

(10) Patent No.: US 9,088,262 B2
(45) Date of Patent: Jul. 21, 2015

(54) VIBRATING DEVICE, METHOD FOR MANUFACTURING VIBRATING DEVICE, AND ELECTRONIC APPARATUS

(75) Inventor: Tetsuya Otsuki, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 269 days.

(21) Appl. No.: 13/401,443

(22) Filed: Feb. 21, 2012

(65) Prior Publication Data

US 2012/0223622 A1 Sep. 6, 2012

(30) Foreign Application Priority Data

Mar. 3, 2011 (JP) ................................. 2011-045999

(51) Int. Cl.
*H01L 41/053* (2006.01)
*H03H 9/02* (2006.01)
*H01L 23/00* (2006.01)
*H01L 23/552* (2006.01)
*H01L 23/047* (2006.01)
(Continued)

(52) U.S. Cl.
CPC ............... *H03H 9/02* (2013.01); *H01L 23/552* (2013.01); *H01L 24/73* (2013.01); *H01L 23/047* (2013.01); *H01L 23/495* (2013.01); *H01L 23/49861* (2013.01); *H01L 2224/32245* (2013.01); *H01L 2224/45144* (2013.01); *H01L 2224/48091* (2013.01); *H01L 2224/48247* (2013.01); *H01L 2224/49171* (2013.01); *H01L 2224/73253* (2013.01); *H01L 2224/73265* (2013.01); *H01L 2924/1461* (2013.01); *H01L 2924/3025* (2013.01)

(58) Field of Classification Search
CPC ............. H01L 2224/4827; H01L 2224/49171; H01L 2224/48091; H01L 2224/73265; H01L 2224/45144; H01L 2224/32245; H01L 23/047; H01L 23/495; H01L 23/552; H01L 23/2473; H01L 23/49816; H01L 24/73; H03H 9/02; H03H 9/1014; H03H 9/1021
USPC .......... 310/344, 348, 340, 370, 365; 257/737, 257/376, 666, 667, 672, 674; 216/19
See application file for complete search history.

(56) References Cited

U.S. PATENT DOCUMENTS 4,520,413 A * 5/1985 Piotrowski et al. ........... 257/421
5,230,144 A * 7/1993 Ootsuki ......................... 29/827
(Continued)

FOREIGN PATENT DOCUMENTS

| JP | A-04-306867 | 10/1992 |
|---|---|---|
| JP | A-07-38334 | 2/1995 |

(Continued)

*Primary Examiner* — Thomas Dougherty
*Assistant Examiner* — Karen B Addison
(74) *Attorney, Agent, or Firm* — Oliff PLC

(57) ABSTRACT

A sensor device includes a substrate, an IC chip, a sensor element, bonding wires, and a lid. The substrate includes a plurality of metal posts which are disposed so as to be electrically independent of each other and an insulator which is filled in a gap between faces different from first faces and second faces of the plurality of metal posts and integrally fixes the plurality of metal posts. The IC chip has electrode pads on an active face and is fixed to a first metal post. The sensor element has vibrating portions and is supported by the IC chip by bonding a supporting portion to the active face of the IC chip. The bonding wires electrically connect the electrode pads with second metal posts. The lid is disposed so as to cover the IC chip and the sensor element.

9 Claims, 11 Drawing Sheets

(51) Int. Cl.
  *H01L 23/495* (2006.01)
  *H01L 23/498* (2006.01)

(56) References Cited

U.S. PATENT DOCUMENTS

| | | | |
|---|---|---|---|
| 7,807,498 B2 * | 10/2010 | Shoji et al. | 257/797 |
| 8,253,505 B2 * | 8/2012 | Ogura et al. | 310/348 |
| 8,502,144 B2 * | 8/2013 | Oosaki et al. | 250/310 |
| 8,502,363 B2 * | 8/2013 | Chiang et al. | 257/676 |
| 8,674,487 B2 * | 3/2014 | Yu et al. | 257/676 |
| 2006/0082260 A1 * | 4/2006 | Kinoshita | 310/348 |
| 2008/0174012 A1 | 7/2008 | Otsuki | |
| 2009/0032943 A1 | 2/2009 | Shoji et al. | |
| 2010/0102423 A1 | 4/2010 | Otsuki | |
| 2010/0302756 A1 | 12/2010 | Otsuki | |
| 2011/0163433 A1 | 7/2011 | Toda et al. | |

FOREIGN PATENT DOCUMENTS

| | | |
|---|---|---|
| JP | A-2000-124376 | 4/2000 |
| JP | A-2002-118423 | 4/2002 |
| JP | A-2005-292079 | 10/2005 |
| JP | A-2008-181959 | 8/2008 |
| JP | A-2009-055015 | 3/2009 |
| JP | A-2009-076947 | 4/2009 |
| JP | A-2010-278186 | 12/2010 |
| JP | A-2011-133299 | 7/2011 |
| JP | A-2011-149789 | 8/2011 |
| WO | WO 2010/035499 A1 | 4/2010 |

* cited by examiner

VIBRATING DEVICE, METHOD FOR MANUFACTURING VIBRATING DEVICE, AND ELECTRONIC APPARATUS

The entire disclosure of Japanese Patent Application No. 2011-045999, filed Mar. 3, 2011 is expressly incorporated by reference herein

BACKGROUND

1. Technical Field

The present invention relates to a vibrating device, a method for manufacturing the vibrating device, and an electronic apparatus having the vibrating device mounted thereon.

2. Related Art

In the related art, in motion sensors as vibrating devices which sense acceleration, angular velocity, and the like, a configuration has been known in which a sensor device including a sensor element as a vibrating reed and a semiconductor circuit element having a function of driving the sensor element is used.

For example, JP-A-2005-292079 (Patent Document 1) discloses a gyro sensor as a motion sensor in which a sensor device including a vibrating gyro element (gyro vibrating reed) as a sensor element and an IC chip as a semiconductor circuit element is contained in a package as a substrate.

In the configuration of the gyro sensor disclosed in Patent Document 1, the IC chip is fixed to a supporting substrate and electrically connected to a lead wiring portion formed on the supporting substrate. Moreover, the sensor element (vibrating gyro element) is connected to a lead wire fixed to the supporting substrate, whereby the sensor element is arranged so as to keep a gap between a semiconductor device and the sensor element and overlap the semiconductor device in plan view to be sealed within the package.

Like the gyro sensor disclosed in Patent Document 1, in a vibrating device having a configuration in which a sensor element (vibrating reed) and an IC chip (semiconductor circuit element) are mounted on a substrate and sealed, ceramic packages have been widely used for the substrate.

However, ceramic packages are generally expensive, which is a bottleneck in reducing the cost of the vibrating devices. Especially in the design change of an IC chip or a sensor element, there is a problem that a relatively high cost is needed in renewing the package.

Moreover, since package manufacturers capable of dealing with miniaturization and refinement for meeting the increased needs for the miniaturization of electronic apparatuses in recent years are limited, there is a problem that it is hard to obtain ceramic packages dealing with the miniaturization.

SUMMARY

An advantage of some aspects of the invention is to solve at least a part of the problems described above, and the invention can be implemented as the following forms or application examples.

Application Example 1

This application example of the invention is directed to a vibrating device including: a substrate including a plurality of metal posts and an insulator, the plurality of metal posts each having a first face and a second face opposite the first face, the plurality of metal posts including a first metal post and a second metal post, the insulator being filled in a gap between faces of the plurality of metal posts and integrally fixing the plurality of metal posts, the faces being different from the first face and the second face; a semiconductor circuit element having an electrode on a third face and fixed to the first metal post with a fourth face facing the first face of the first metal post, the fourth face being opposite the third face; a vibrating reed having a supporting portion and a vibrating portion extended from the supporting portion, the vibrating reed being supported by the semiconductor circuit element by bonding the supporting portion to the third face of the semiconductor circuit element; a conductive member electrically connecting the electrode with the second metal post; and a lid disposed so as to cover the semiconductor circuit element and the vibrating reed.

The substrate of the vibrating device having the configuration can be formed by partially etching a metal plate from a first face to form a plurality of convex portions, filling and fixing an insulator in a recess formed in accordance with the formation of the convex portions, and then partially etching the metal plate from a second face so as to be in communication with the recess. That is, the substrate can be formed by performing an etching process on a metal plate using a well-known photolithographic technique. Therefore, compared to a ceramic substrate or a ceramic package used as a substrate in a vibrating device in the past, a material used for a substrate is inexpensive, and the design change of the semiconductor circuit element or the vibrating reed can be dealt with only by changing a photolithographic photomask. Therefore, the vibrating device can be provided at low cost.

Application Example 2

This application example of the invention is directed to the vibrating device of the above application example, wherein the plurality of metal posts include a cylindrical third metal post arranged so as to surround in plan view the first metal post and the second metal post, the insulator is filled on the side of an inner wall face of the third metal post, the lid is bonded to the first face of the third metal post, and a distance between the first face and the second face of the third metal post is shorter than a distance between the first face and the second face of the first metal post and the second metal post.

According to the configuration, it is possible to provide the vibrating device including the substrate, in which the first metal post and the second metal post are fixed with the insulator in a form of being electrically independent of each other within the cylindrical third metal post, and the semiconductor circuit element and the vibrating reed which are mounted on the substrate and sealed with the lid. Furthermore, since the second face of the third metal post which does not contribute to an electrical connection when the vibrating device is mounted on an external substrate is located closer to the side of the first face than the second faces of the first metal post and the second metal post, it is possible to avoid the second face of the third metal post from contacting wiring of the external substrate. Therefore, troubles such as a short circuit can be avoided, making it possible to increase the degree of freedom of the wiring layout of the external substrate.

Application Example 3

This application example of the invention is directed to the vibrating device of the above application example, wherein the plurality of metal posts include a fourth metal post and a metal wiring portion, the metal wiring portion electrically connects the second metal post with the fourth metal post, and a distance between the first face and the second face of the metal wiring portion is shorter than a distance between the first face and the second face of the first metal post, the second metal post, and the fourth metal post.

According to the configuration, since the second metal post and the fourth metal post are electrically connected with the metal wiring portion in a state of not contacting an external substrate, the second metal post connected to the electrode of the semiconductor circuit element via the conductive member can be rearranged to the fourth metal post to be connected to the external substrate. Therefore, the design change of the external substrate can be dealt with relatively easily.

Application Example 4

This application example of the invention is directed to the vibrating device of the above application example, which further includes a first plated layer on the first faces of the plurality of metal posts, wherein the first plated layer protrudes outwardly from the first face.

In the vibrating device having the configuration, the first plated layer protruding outwardly from the first face of the metal post is formed by, in manufacturing steps of the vibrating device, forming the first plated layer, before a step of forming parts of the metal posts by etching the side of the first face of the metal plate, and performing etching using the first plated layer as an etching mask.

According to this configuration, since the first plated layer used as the etching mask can be used as it is as contact metal in achieving an electrical connection of the semiconductor circuit element and the vibrating reed with the metal posts, a remarkable effect is provided on a reduction in manufacturing cost.

Application Example 5

This application example of the invention is directed to the vibrating device of the above application example, which further includes a second plated layer on the second faces of the metal posts and on a face different from the second faces on the side of the second face.

In the vibrating device having the configuration, the second plated layer provided on the second faces of the metal posts and on the face different from the second faces on the side of the second face is formed by, in a manufacturing method thereof, an electroless plating method after forming the metal posts by etching from the second face of the metal plate.

According to this configuration, the plated layer can be formed on the second face of each of the metal posts and also on an etching face different from the second face. Therefore, compared to the case where the etching face of the metal post is exposed, corrosion resistance is improved.

Moreover, for example, when the vibrating device is mounted on an external substrate by solder bonding, solder wets and spreads to the etching face of each of the metal posts, making it possible to form a favorable fillet.

Accordingly, a vibrating device with high reliability can be provided.

Application Example 6

This application example of the invention is directed to the vibrating device of the above application example, wherein the first face of the third metal post is located at a higher position than the first faces of the other metal posts.

According to the vibrating device having the configuration, since, for example, the semiconductor circuit element and the vibrating reed which are bonded above the first metal post are made into a form in which they are surrounded by the third metal post, electromagnetic waves can be blocked by a shield effect provided by the third metal post. Therefore, it is possible to avoid malfunction due to the influence of external electromagnetic waves, or an adverse influence on the outside exerted by unwanted electromagnetic waves of the semiconductor circuit element.

Application Example 7

This application example of the invention is directed to the vibrating device of the above application example, wherein the first face of the third metal post is located at a higher position than the vibrating reed.

According to the configuration, since the semiconductor circuit element and the vibrating reed are entirely surrounded by the third metal post in a horizontal direction, it is possible to provide a vibrating device in which a shield effect due to the third metal post is more highly exerted.

Application Example 8

This application example of the invention is directed to the vibrating device of the above application example, wherein the lid includes a metal portion, and the lid is electrically connected with the third metal post.

According to the configuration, the lid covering the semiconductor circuit element or the vibrating reed provides a shield effect to avoid malfunction due to the influence of external electromagnetic waves, or an adverse influence on the outside exerted by unwanted electromagnetic waves of the semiconductor circuit element, making it possible to provide a vibrating device having excellent characteristics.

Application Example 9

This application example of the invention is directed to a method for manufacturing a vibrating device including: a first etching step of partially etching a metal plate having a first face and a second face opposite the first face, from the first face to form a plurality of convex portions; an insulator formation step of filling and fixing an insulator in a recess formed in accordance with the formation of the convex portions in the first etching step; a second etching step of partially etching, after the insulator formation step, the metal plate from the second face so as to be in communication with the recess to thereby form a plurality of metal posts extending from the convex portions to the second face and including a first metal post and a second metal post; a semiconductor circuit element bonding step of bonding, to the first face of the first metal post, a semiconductor circuit element having an electrode on a third face with a fourth face facing the first face, the fourth face being opposite the third face; a vibrating reed fixing step of fixing a vibrating reed to the third face of the semiconductor circuit element; a bonding step of electrically connecting the electrode and the second metal post with a conductive member; and a sealing step of disposing a lid so as to cover the semiconductor circuit element and the vibrating reed.

According to the configuration, when the vibrating device is configured by sealing the semiconductor circuit element and the vibrating reed with the lid, a substrate on which the semiconductor circuit element and the vibrating reed are mounted can be formed by performing an etching process on the metal plate using a well-known photolithographic technique.

Thus, compared to a ceramic substrate or a ceramic package used as a substrate in a vibrating device in the past, a material used for a substrate is inexpensive, and the design change of the semiconductor circuit element or the vibrating reed can be dealt with only by changing a photolithographic photomask. Therefore, a reduction in cost of the vibrating device can be achieved.

Application Example 10

This application example of the invention is directed to the method for manufacturing the vibrating device of the above application example, which further includes a first plating step of forming a first plated layer on the first face before the first etching step, wherein in the first etching step, the first plated layer is used as an etching mask.

According to the configuration, since the first plated layer used as the etching mask can be used as it is as contact metal in achieving an electrical connection of the semiconductor circuit element and the vibrating reed with the metal posts, a remarkable effect is provided on a reduction in manufacturing cost.

Application Example 11

This application example of the invention is directed to the method for manufacturing the vibrating device of the above application example, which further includes a second plating step by an electroless plating method after the second etching step.

According to the configuration, the plated layer can be formed on the second face of each of the metal posts and also on an etching face different from the second face. Therefore, compared to the case where the etching face of the metal post is exposed, corrosion resistance is improved.

Moreover, for example, when the vibrating device is mounted on an external substrate by solder bonding, solder wets and spreads to the etching face of each of the metal posts, making it possible to form a favorable fillet.

Accordingly, a vibrating device with high reliability can be provided.

Application Example 12

This application example of the invention is directed to the method for manufacturing the vibrating device of the above application example, which further includes a plating step of simultaneously forming, after the second etching step, the first plated layer of the first face and the second plated layer of the second face by an electroless plating method.

According to the configuration, when a heating step is needed up to the second etching step, the first plated layer is disposed on the first face of the substrate and also the second plated layer is disposed on the second face while avoiding the oxidation or deterioration of the plated layer due to the heat of the heating step. Therefore, a vibrating device with high reliability can be provided.

For example, when a material which needs to be baked, such as alumina, is used as the insulator, the plated layer is not exposed to the heat in baking the material.

Application Example 13

This application example of the invention is directed to the method for manufacturing a vibrating device of the above application example, wherein, by the first etching step and the second etching step, a cylindrical third metal post which is arranged so as to surround in plan view the first metal post and the second metal post and whose second face is located closer to the side of the first face than the second faces of the first metal post and the second metal post is formed, in the insulator formation step, the insulator is filled on the side of an inner wall face of the third metal post, and in the sealing step, the lid is bonded to the first face of the third metal post.

According to the configuration, it is possible to provide the vibrating device including the substrate, in which the first metal post and the second metal post are fixed with the insulator in a state of being electrically independent of each other within the cylindrical third metal post, and the semiconductor circuit element and the vibrating reed which are mounted on the substrate and sealed with the lid. Furthermore, since the second face of the third metal post which does not contribute to an electrical connection when the vibrating device is mounted on an external substrate is located closer to the side of first face than the second faces of the first metal post and the second metal post, it is possible to avoid the second face of the third metal post from contacting wiring of the external substrate. Therefore, troubles such as a short circuit can be avoided, increasing the degree of freedom of the wiring layout of the external substrate.

Application Example 14

This application example of the invention is directed to the method for manufacturing a vibrating device of the above application example, which further includes, before the first etching step, a step of masking a region serving as the first face of the third metal post to etch the metal plate by a predetermined amount from the first face.

According to the configuration, the semiconductor circuit element, the vibrating reed, and connecting members such as conductive members electrically connecting the semiconductor circuit element with the vibrating reed, which are mounted on the first metal post and the second metal post, can be surrounded by the third metal post. Therefore, a substrate having a form like a package in the past can be configured. That is, the semiconductor circuit element or the vibrating reed mounted on the substrate can be sealed with a plate-like lid. Moreover, the semiconductor circuit element or the vibrating reed is surrounded by the third metal post, whereby electromagnetic waves can be blocked by a shield effect provided by the third metal post. Therefore, it is possible to avoid malfunction due to the influence of external electromagnetic waves, or an adverse influence on the outside exerted by unwanted electromagnetic waves of the semiconductor circuit element.

With the use of a lid having a metal or a metal layer, a shield effect can be obtained more remarkably.

Application Example 15

This application example of the invention is directed to the method for manufacturing a vibrating device of the above application example, wherein, in the first etching step, the insulator formation step, and the second etching step, a plurality of substrates each of which has the plurality of metal posts are formed in an array in plan view in the metal plate, in the semiconductor circuit element bonding step, a plurality of the semiconductor circuit elements are bonded in an array in plan view to the plurality of substrates, respectively, in the vibrating reed connecting step, a plurality of the vibrating reeds are connected in an array above the plurality of semiconductor circuit elements, respectively, in the bonding step, the electrodes of the plurality of semiconductor circuit elements and the second metal posts of the plurality of substrates are connected with the conductive members, respectively, in the sealing step, the semiconductor circuit element and the vibrating reed which are bonded to each of the plurality of substrates are collectively sealed with a plurality of the lids to form a plurality of vibrating devices coupled to the metal plate, and the method includes, after the sealing step, a dicing step of cutting the plurality of coupled vibrating devices into individual pieces.

According to the configuration, the plurality of substrates which are coupled to the metal plate are formed, the semiconductor circuit element and the vibrating reed are bonded to each of the substrates and then collectively sealed with the lids, and the plurality of vibrating devices which are coupled to the metal plate are cut out into individual pieces. Therefore, manufacturing efficiency is improved, making it possible to reduce the manufacturing cost.

Application Example 16

This application example of the invention is directed to an electronic apparatus including the vibrating device according to any one of the above application examples or the vibrating device manufactured by the manufacturing method according to any one of the above application examples.

The electronic apparatus having the configuration includes the vibrating device of the application example or the vibrating device manufactured by the manufacturing method of the application example, that is, the vibrating device which easily deals with the design change of the semiconductor circuit element or the vibrating reed and is low in cost, or the vibrating device which has excellent sensitivity or oscillation characteristics and high reliability. Therefore, the electronic apparatus has high functionality, and a reduction in cost can be achieved.

BRIEF DESCRIPTION OF THE DRAWINGS

The invention will be described with reference to the accompanying drawings, wherein like numbers reference like elements.

FIGS. 1A to 1C are schematic views showing a schematic configuration of a first embodiment of a sensor device as a vibrating device, in which FIG. 1A is a plan view viewed from the side (upper side) of an IC chip as a semiconductor circuit element, FIG. 1B is a cross-sectional view along line A-A of FIG. 1A, and FIG. 1C is a plan view viewed from the side (lower side) of a bottom face.

FIGS. 10A and 10B are schematic views showing a schematic configuration of a modified example of a sensor device, in which FIG. 10A is a plan view viewed from the side (upper side) of an IC chip, and FIG. 10B is a cross-sectional view along line B-B of FIG. 10A.

FIGS. 11A to 11C are schematic views each showing an example of an electronic apparatus on which the sensor device or a gyro sensor (motion sensor) according to the embodiments or the modified example is mounted, in which FIG. 11A is a perspective view of a digital video camera, FIG. 11B is a perspective view of a mobile phone, and FIG. 11C is a perspective view of a personal digital assistant (PDA).

DESCRIPTION OF EXEMPLARY EMBODIMENTS

Hereinafter, embodiments in which the invention is embodied will be described according to the drawings.

First Embodiment

Sensor Device

Figure 1A:
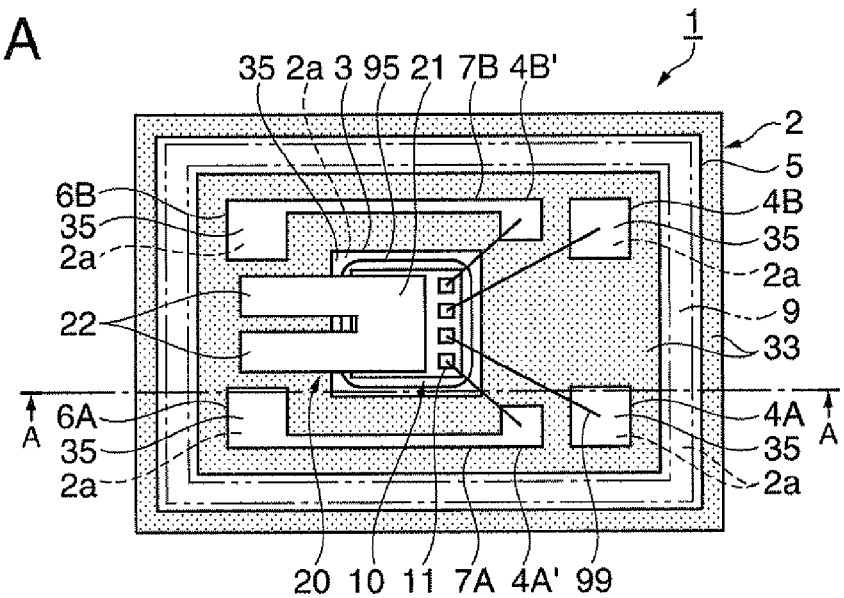
Figure 1B:
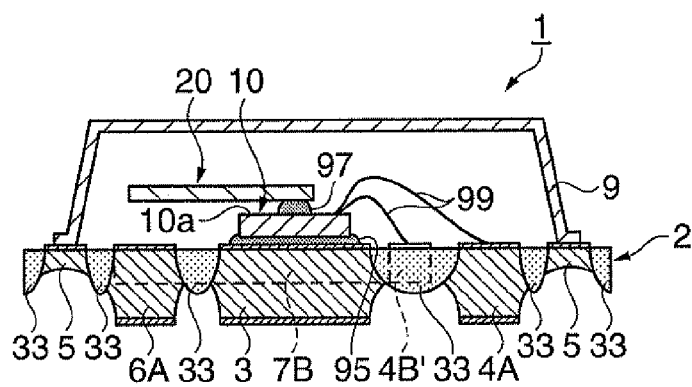
Figure 1C:
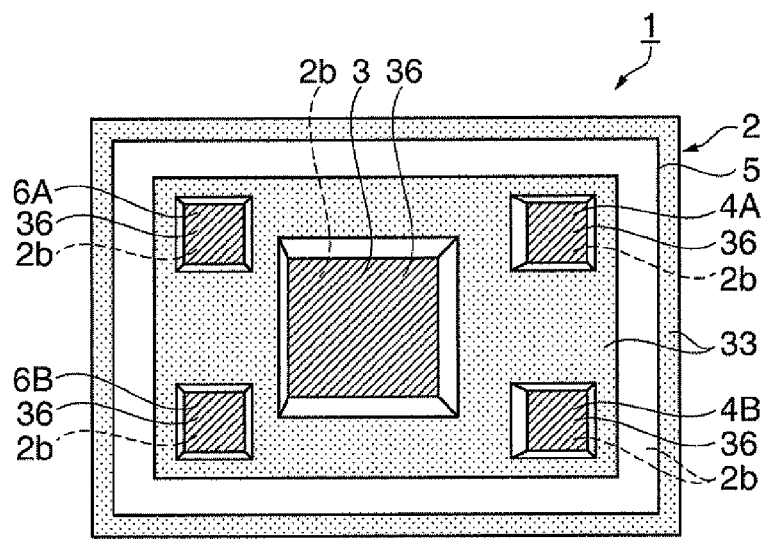

FIGS. 1A to 1C are schematic views showing a schematic configuration of a first embodiment of a sensor device as a vibrating device, in which FIG. 1A is a plan view viewed from the side (upper side) of an IC chip as a semiconductor circuit element, FIG. 1B is a cross-sectional view along line A-A of FIG. 1A, and FIG. 1C is a plan view viewed from the side (lower side) of a bottom face.

In FIGS. 1A to 1C, the sensor device 1 has a substrate 2, an IC chip 10, a sensor element 20 as a vibrating reed, and a lid 9. The substrate 2 includes a plurality of metal posts and an insulator 33 which integrally fixes the metal posts in a state of being electrically independent of each other. The IC chip 10 and the sensor element 20 are mounted on the substrate 2. The lid 9 is disposed so as to cover the IC chip 10 and the sensor element 20.

The substrate 2 includes the plurality of metal posts which are formed by performing an etching process on a metal plate having a first face 2a and a second face 2b facing the side opposite to the first face 2a. The metal posts are disposed electrically independent of each other. The substrate 2 of the embodiment has a first metal post 3 to which the IC chip 10 is fixed, two pairs of second metal posts 4A, 4B, 4A', and 4B', fourth metal posts 6A and 6B, and a cylindrical third metal post 5. The two pairs of second metal posts 4A, 4B, 4A', and 4B' are electrically connected to electrode pads 11 as electrodes of the IC chip 10 via bonding wires 99 as conductive members. The fourth metal posts 6A and 6B are electrically connected to the pair of second metal posts 4A' and 4B' of the two pairs of second metal posts 4A, 4B, 4A', and 4B'. The cylindrical third metal post 5 is arranged so as to surround in plan view the first metal post 3, the second metal posts 4A, 4B, 4A', and 4B', and the fourth metal posts 6A and 6B.

The plurality of metal posts, that is, the first metal post 3, the second metal posts 4A, 4B, 4A', and 4B', the fourth metal posts 6A and 6B, and the third metal post 5 are arranged with gaps so as to be electrically independent of each other. In the gaps between the metal posts, an insulator 33 is filled and hardened. With this configuration, the substrate 2 is formed in which the first metal post 3, the second metal posts 4A, 4B, 4A', and 4B', and the fourth metal posts 6A and 6B, which are arranged so as to be surrounded by the cylindrical third metal post 5, are integrally fixed.

The substrate 2 of the embodiment includes the two pairs of second metal posts 4A, 4B, 4A', and 4B' which are electrically connected to the electrode pads 11 of the IC chip 10 via the bonding wires 99. Of these metal posts, the one pair of second metal posts 4A' and 4B' are electrically connected to the fourth metal posts 6A and 6B via metal wiring portions 7A and 7B, respectively. Specifically, the second metal post 4A', the metal wiring portion 7A, and the fourth metal post 6A which are integrally formed by performing an etching process on a metal plate, and the second metal post 4B', the metal wiring portion 7B, and the fourth metal post 6B which are integrally formed similarly are included.

In this case, the second faces 2b of the one pair of second metal posts 4A' and 4B' and the metal wiring portions 7A and 7B are located closer to the side of the first face 2a than the second faces 2b of the first metal post 3, the other pair of second metal posts 4A and 4B, and the fourth metal posts 6A and 6B. In other words, a distance between the first face 2a and the second face 2b of the one pair of second metal posts 4A' and 4B' and the metal wiring portions 7A and 7B is shorter than a distance between the first face 2a and the second face 2b of the first metal post 3, the other pair of second metal posts 4A and 4B, and the fourth metal posts 6A and 6B. That is, the second faces 2b of the first metal post 3, the other pair of second metal posts 4A and 4B, and the fourth metal posts 6A and 6B serve as mounting terminals for contacting an external substrate to achieve an electrical connection when the sensor device 1 is mounted on the external substrate, while the one pair of second metal posts 4A' and 4B' and the metal wiring portions 7A and 7B do not contact the external substrate. The one pair of second metal posts 4A' and 4B', which are electrically connected to the electrode pads 11 of the IC chip 10 via the bonding wires 99, are configured so as to achieve a connection to the external substrate with the second faces 2b (mounting terminals) of the fourth metal posts 6A and 6B which are electrically connected through the metal wiring portions 7A and 7B.

Moreover, in the substrate 2, also the second face 2b of the cylindrical third metal post 5 which is arranged so as to surround the plurality of metal posts is located closer to the side of the first face 2a than the second faces 2b of the first metal post 3, the second metal posts 4A and 4B, and the fourth metal posts 6A and 6B which serve for a connection to the external substrate, so that the second face 2b of the cylindrical third metal post 5 does not contact the external substrate. In other words, a distance between the first face 2a and the third face 2b of the third metal post is shorter than a distance between the first face 2a and the second face 2b of the first metal post 3, the second metal posts 4A and 4B, and the fourth metal posts 6A and 6B which serve for a connection to the external substrate. The insulator 33 is filled on the side of an inner wall face of the third metal post 5, and the lid 9 is bonded to the first face 2a of the third metal post 5.

With the third metal post 5 having the configuration described above, it is possible to provide the sensor device 1 including the substrate 2, in which the plurality of metal posts are fixed with the insulator in a form of being electrically independent of each other within the cylindrical third metal post 5, and the IC chip 10 and the sensor element which are mounted on the substrate 2 and sealed with the lid 9. Moreover, since the second face 2b of the third metal post 5 which does not contribute to an electrical connection when the sensor device 1 is mounted on an external substrate is located closer to the side of the first face 2a than the second faces of the first metal post 3, the second metal posts 4A and 4B, and the fourth metal posts 6A and 6B which serve for an electrical connection to the external substrate, the second face 2b of the third metal post 5 does not contact wiring of the external substrate. Therefore, troubles such as a short circuit can be avoided, providing such an effect that the degree of freedom of the wiring layout of the external substrate is increased.

A first plated layer 35 is disposed on the first face 2a of each of the metal posts of the substrate 2. A second plated layer 36 is disposed on the second face 2b of each of the metal posts other than the one pair of second metal posts 4A' and 4B' and the cylindrical third metal post 5. The first plated layer 35 and the second plated layer 36 which are respectively disposed on the first face 2a and the second face 2b of each of the metal posts protrude outwardly from the first face 2a and the second face 2b, respectively, of each of the metal posts. This is because, as will be described later, when the metal posts are formed by performing an etching process on a metal plate in manufacturing steps of the substrate 2, the first plated layer 35 and the second plated layer 36 are used as etching masks.

That is, the metal posts of the substrate 2 are formed through etching twice, once as a step of etching a metal plate from the side of the first face 2a using the first plated layer 35 as an etching mask and once as a step of etching the metal plate from the side of the second face 2b using the second plated layer 36 as an etching mask. In each of the etching steps, when etching is performed from the first face 2a or the second face 2b of the metal plate using the first plated layer 35 or the second plated layer 36 as an etching mask, so-called side etching occurs in which the metal plate just below an edge portion of the first plated layer 35 or the second plated layer 36 of each of the metal posts is etched in the course of progress of etching from the first face 2a or the second face 2b to the middle of the metal plate. Because of the side etching, the form is formed in which the first plated layer 35 of the first face 2a and the second plated layer 36 of the second face 2b of each of the metal posts protrude outwardly from each of the metal posts.

The insulator 33 is formed, in later-described manufacturing steps of the substrate 2, after etching the metal plate from the side of the first face 2a before etching from the side of the second face 2b. That is, a plurality of convex portions which serve as parts of the metal posts are formed by performing partial etching from the first face 2a of the metal plate, and thereafter the insulator 33 in a state of having fluidity is filled in a recess formed in accordance with the formation of the convex portions and then hardened, whereby the insulator is formed. Thereafter, partial etching is performed from the second face 2b of the metal plate so that the metal plate is communicated with parts of the recess, whereby the plurality of metal posts each of which extends from the first face 2a to the second face 2b of the convex portion are disposed in an array in plan view while being electrically independent of each other.

Above the first face 2a of the first metal post 3 of the substrate 2, the IC chip 10 as a semiconductor circuit element is bonded via a bonding member (die attach material).

On the side of an active face 10a of the IC chip 10, an integrated circuit (not shown) which is configured to include semiconductor elements such as transistors or memory elements is formed. The integrated circuit is provided with, for example, a driving circuit for driving and vibrating the sensor element 20 and a detector circuit which detects detection vibrations generated in the sensor element 20 when a physical quantity is applied.

The IC chip 10 includes the plurality of electrode pads 11 which are disposed on the side of the active face 10a and a mount electrode which is electrically connected to aexternal connection terminal of the sensor element 20.

Moreover, although not shown in the drawing, an insulating film serving as a passivation film is formed on the active face 10a of the IC chip 10. In the insulating film, an opening which exposes the electrode pads 11 and the mount electrode to the outside is disposed. The insulating film can be formed using an inorganic insulating material such as silicon oxide ($SiO_2$) or silicon nitride ($Si_3N_4$), or a resin such as a polyimide resin, a silicone-modified polyimide resin, an epoxy resin, a silicone-modified epoxy resin, an acrylic resin, a phenol resin, BCB (benzocyclobutene), or PBO (polybenzoxazole).

In the integrated circuit formed in the IC chip 10, not-shown other electrodes other than the electrode pads 11 are formed. Wiring is connected to these other electrodes similarly to the case of the electrode pads 11. The IC chip 10 of the embodiment has the mount electrode connected to the sensor element 20.

The electrode pads 11 and the other electrodes can be formed using titanium (Ti), titanium nitride (TIN), aluminum (Al), copper (Cu), an alloy including them, or the like. Especially for the electrode pad 11, it is preferable, for enhancing bondability in wire bonding, to plate the surface of the electrode pad with nickel (Ni) or gold (Au). By doing this, it is possible to prevent especially a decrease in contact property and bondability caused by rust.

Moreover, the topmost surface of the electrode pads 11 and the other electrodes may be subjected to surface treatment such as solder plating or solder precoat.

The integrated circuit formed in the IC chip 10 with the configuration described above is electrically connected to the sensor element 20 via a bonding member disposed on the mount electrode. With this configuration, the sensor element 20 is held to the IC chip 10. In this case, a gap is disposed between the sensor element 20 and the IC chip 10 with the bonding member 97 disposed therebetween.

The bonding member 97 is the bonding member 97 having conductivity and a thickness as a gap member for providing a gap between the IC chip 10 and the sensor element 20. For example, conductive adhesive such as silver (Ag) paste, or a stud bump formed of gold (Au) or the like can be used for the bonding member. The stud bump is formed by forming a gold ball using a gold wire by discharge heating and bonding the gold ball on the mount electrode of the IC chip by applying ultrasound or other methods. With the use of a gold wire having a small wire diameter, a fine bump can be formed relatively easily.

The sensor element 20 is formed using, as a base material (material constituting a main portion), quartz crystal which is a piezoelectric material, for example. Quartz crystal has the X-axis called an electrical axis, the Y-axis called a mechanical axis, and the Z-axis called an optic axis.

The sensor element 20 formed using quartz crystal is cut out along a plane defined by the X-axis and the Y-axis which are perpendicular to each other on the crystal axis of quartz crystal and is processed into a plate shape. The sensor element has a predetermined thickness in the Z-axis direction which is perpendicular to the plane. The predetermined thickness is appropriately set according to an oscillating frequency (resonant frequency), external size, workability, and the like.

The plate which forms the sensor element 20 is allowed to have some margin of error of a cut angle from quartz crystal for each of the X-axis, the Y-axis, and the Z-axis. For example, a plate obtained by rotating quartz crystal about the X-axis by from 0 degree to 2 degrees and cutting out from the quartz crystal can be used. The same applies to the Y-axis and the Z-axis.

The sensor element 20 of the embodiment is a so-called tuning-fork type vibrating reed having a supporting portion 21 and a pair of vibrating portions (vibrating arms) 22 and 22 which are extended in parallel from the supporting portion 21. The sensor element 20 having the shape described above is formed by etching (wet etching or dry etching) using a photolithographic technique. A plurality of the sensor elements 20 can be obtained from one quartz-crystal wafer.

Although not shown, driving electrodes (excitation electrodes) and detecting electrodes are disposed in the vibrating portion 22 of the sensor element 20. On a face of the supporting portion 21 of the sensor element 20, the face facing the IC chip 10, an external connection terminal connected to routed wiring extracted from the driving electrodes and the detecting electrodes is disposed. The external connection terminal is electrically connected to the mount electrode of the IC chip 10 described above. The external connection terminal and the mount electrode are bonded together via the bonding member 97.

As described above, above the substrate 2 to which the IC chip 10 and the sensor element 20 are bonded, the lid 9 having a cap shape is bonded so as to cover the IC chip 10 and the sensor element 20. Although the lid 9 can be formed of ceramic or the like, the lid 9 using a metal such as Kovar is used in the embodiment.

The lid 9 is bonded above the first face 2a of the cylindrical third metal post 5 of the substrate 2 by a bonding method such as seam welding via a seam ring while achieving an electrical connection. Thus, a space formed by the substrate 2 and the lid 9 is airtightly sealed. In this case, it is desirable that the space in which the IC chip 10 and the sensor element 20 are contained is held in a vacuum state (state where the degree of vacuum is high) or in an inert gas atmosphere so that vibrations of the sensor element 20 are not disturbed. In a sealing step of bonding the lid 9, sealing is performed while performing deaeration from the space to the outside, or sealing is performed by injecting an inert gas such as nitrogen ($N_2$) or argon(Ar).

According to the sensor device 1 of the first embodiment, when the sensor device 1 is configured by sealing the IC chip 10 and the sensor element 20 with the lid 9, the substrate 2 on which the IC chip 10 and the sensor element 20 are mounted can be formed by performing an etching process on a metal plate using a well-known photolithographic technique, according to the configuration.

Thus, compared to a ceramic substrate or a ceramic package used as a substrate in a sensor device (vibrating device) in the past, a material used for a substrate is inexpensive and the design change of the IC chip or the sensor element 20 can be dealt with only by changing a photolithographic photomask. Therefore, it is possible to provide the sensor device 1 whose cost is reduced.

Method for Manufacturing Sensor Device

Next, a method for manufacturing the sensor device 1 of the first embodiment will be described.

Figure 2:
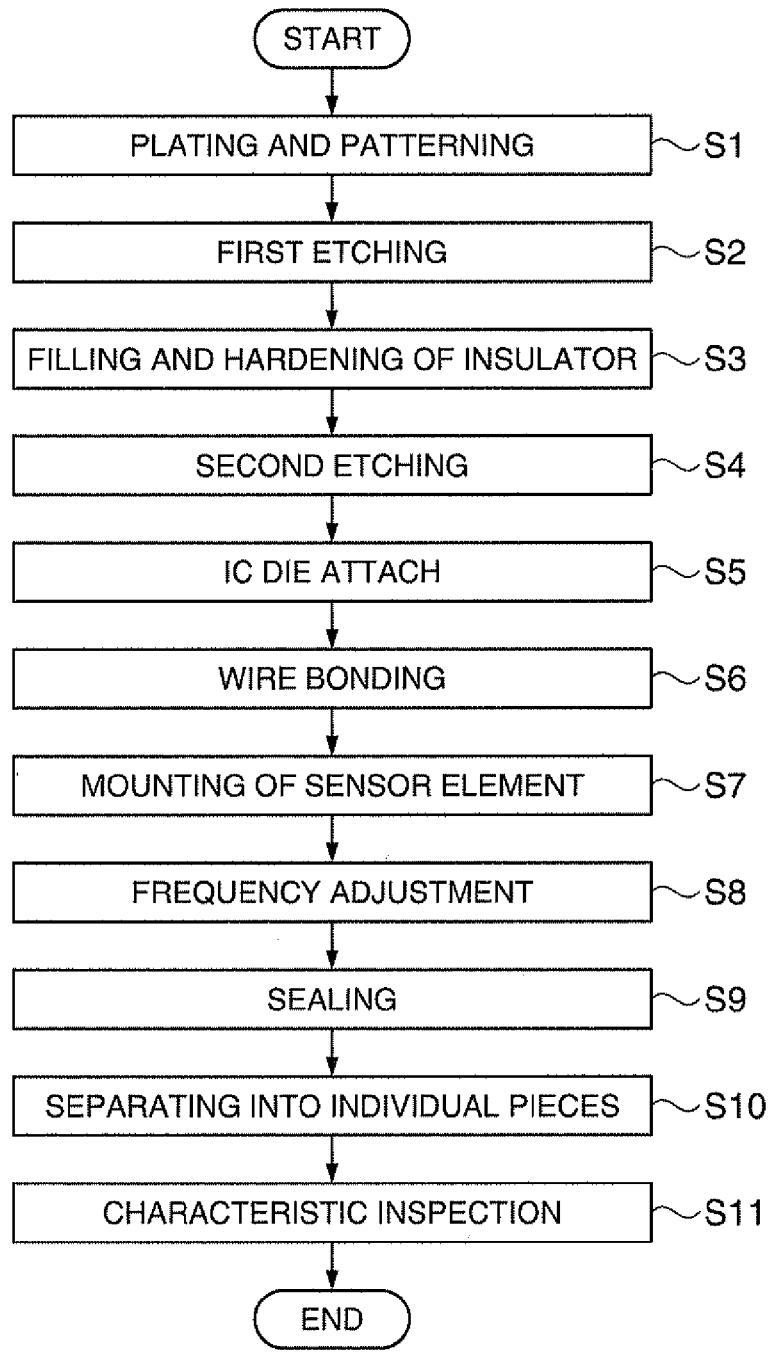
FIG. 2 is a flowchart showing a method for manufacturing the sensor device.

FIG. 2 is a flowchart showing the method for manufacturing the sensor device 1.

FIGS. 3A to 4C are front cross-sectional views each schematically explaining a form of each step in the method for manufacturing the sensor device 1.

Figure 5:
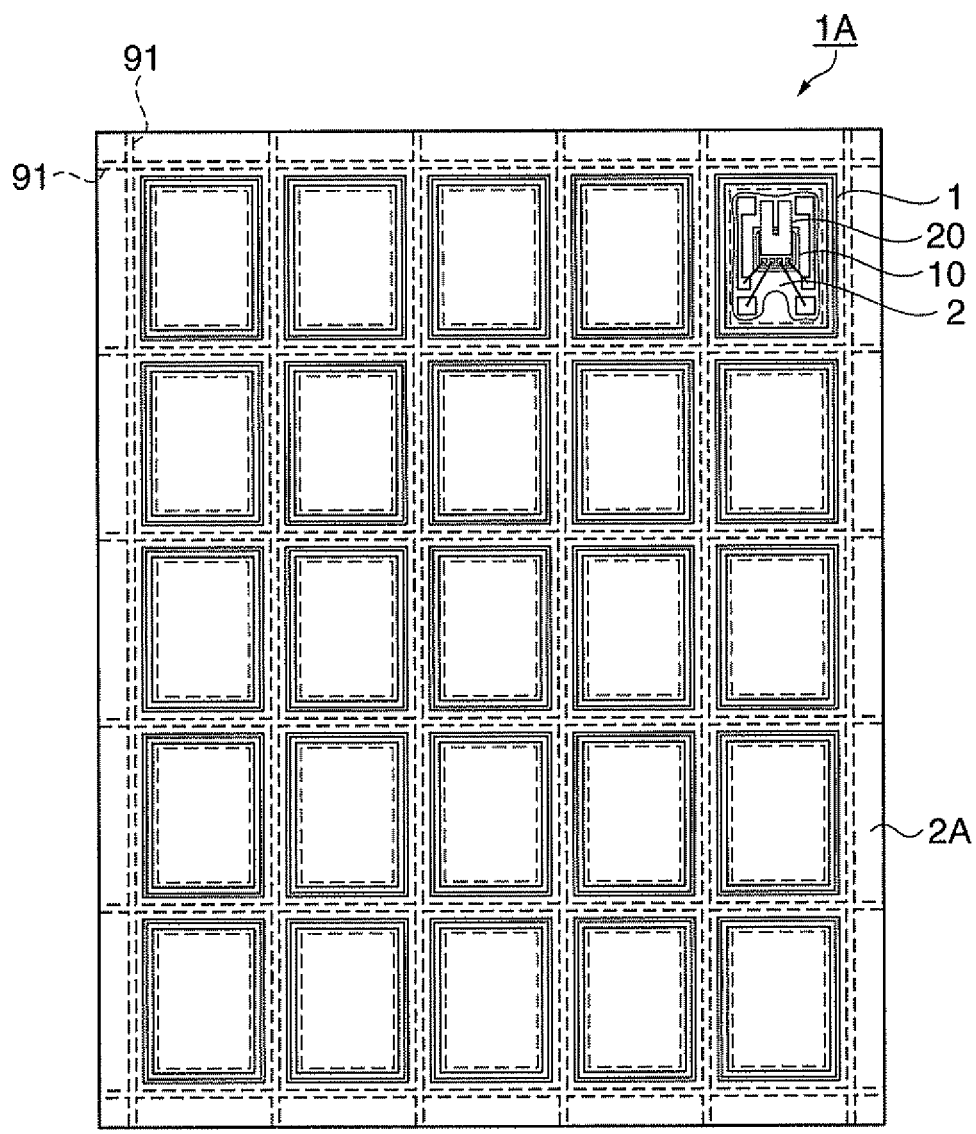
FIG. 5 is a plan view showing a process in which a plurality of sensor devices are formed vertically and horizontally in an array in a metal plate sheet in the method for manufacturing the sensor device.

FIG. 5 is a plan view showing a process in which a plurality of sensor devices 1 are formed vertically and horizontally in an array in a metal plate sheet in the method for manufacturing the sensor device 1.

In the manufacturing method of the sensor device of the embodiment, a method is adopted in which a plurality of substrates 2 are formed in an array in plan view in one metal plate, the IC chip 10 and the sensor element 20 are bonded to each of the substrates and sealed with the lid 9, and thereafter dicing is performed to thereby collectively obtain the plurality of sensor devices 1 in individual pieces. FIGS. 3A to 4C are partial cross-sectional views each showing a region where one sensor device 1 is formed.

Figure 3A:
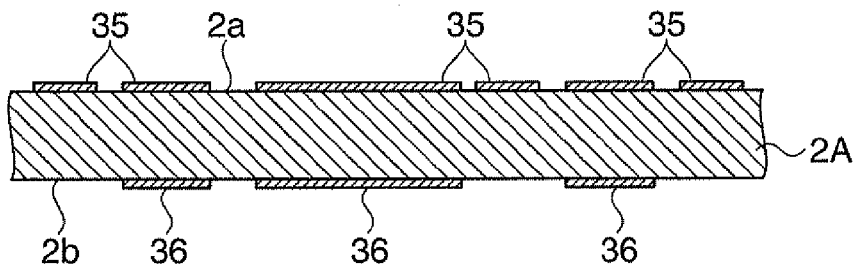
FIGS. 3A to 3D are front cross-sectional views each schematically explaining a form in each step in the method for manufacturing the sensor device.

First as shown in FIG. 3A, the first plated layer 35 and the second plated layer 36 are formed respectively on the first face 2a and the second face 2b of a metal plate sheet 2A having an area in which the plurality of sensor devices 1 can be formed (first plating step), and thereafter each of the first plated layer 35 and the second plated layer 36 is patterned, whereby etching masks for forming a plurality of metal posts are formed.

Specifically, in the first plating step, the first plated layer 35 is first formed on the entire surface of the first face of the metal plate sheet 2A, and the second plated layer 36 is formed on the entire surface of the second face, by an electrolytic plating method or the like. The first plated layer 35 and the second plated layer 36 can be formed simultaneously.

Next, parts of the first plated layer 35 and the second plated layer 36 are removed using photolithography, whereby the first plated layer 35 and the second plated layer 36 serving as etching mask patterns for forming the plurality of metal posts are formed on the first face 2a and the second face 2b, respectively, as shown in FIG. 3A (Step S1 of FIG. 2).

The formation of etching mask patterns using the first plated layer 35 and the second plated layer 36 can be done also by a method in which plating mask patterns using a photoresist which is formed using photolithography are formed respectively on the first face 2a and the second face 2b of the metal plate sheet 2A, the first plated layer 35 and the second plated layer are selectively formed, and then the photoresist is peeled.

Figure 3B:
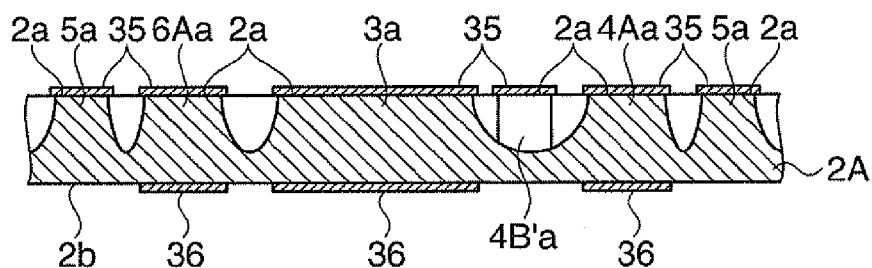

Next as shown in FIG. 3B, first etching is performed in which partial etching is performed from the first face 2a of the metal plate sheet 2A using the first plated layer 35 as an etching mask to form a plurality of convex portions 3a, 4Aa, 4B'a, 5a, and 6Aa serving as parts of the plurality of metal posts (Step S2 of FIG. 2). That is, etching is stopped when the metal plate sheet 2A is etched to a predetermined depth before the metal plate sheet is totally etched to be eliminated (that is, before penetration) between the plurality of convex portions 3a, 4Aa, 4B'a, 5a, and 6Aa. With this half-etching, the convex portion 3a serving as a part of the first metal post 3, the convex portions 4Aa and 4B'a serving as respective parts of the second metal posts 4A and 4B', the convex portion 5a serving as a part of the third metal post 5, and the convex portion 6Aa serving as a part of the fourth metal post 6A are formed.

In the sections of FIGS. 3A to 4C, the second metal posts 4B and 4A' and the fourth metal post 6B which form pairs with the second metal posts 4A and 4B' and the fourth metal post 6A, respectively, are not shown. However, convex portions serving as parts of the second metal posts 4B and 4A' and the fourth metal post GB are formed simultaneously, and they are processed simultaneously also in subsequent steps (hereinafter, the description is omitted).

Moreover, in the first etching step, parts of the metal wiring portion 7B and the metal wiring portion 7A (not shown) which forms a pair with the metal wiring portion 7B are formed simultaneously.

For the metal plate sheet 2A, copper (Cu), for example, can be used. In the case of performing half-etching on a copper plate in the first etching step, dip-type or spray-type wet etching, for example, is performed. For an etchant, a ferric chloride solution or an alkaline etching solution (hereinafter referred to as alkaline solution), for example, is used.

When the first plated layer 35 is formed of, for example, nickel/palladium/gold (Ni/Pd/Au) or nickel/gold (Ni/Au), an alkaline solution is preferably used for the etchant. Since Ni is hard to dissolve in an alkaline solution, the first plated layer 35 is left to be formed so as to protrude outwardly from the surface (the first face 2a) of each of the convex portions 3a, 4Aa, 4B'a, 5a, and 6Aa as shown in FIG. 33.

Figure 3C:
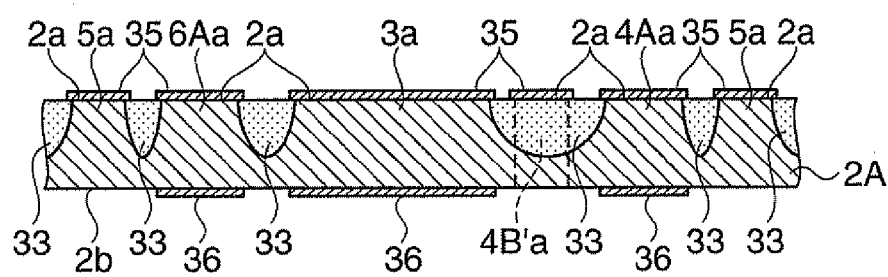

Next as shown in FIG. 3C, insulator formation is performed in which the insulator 33 is filled and hardened in a recess formed in accordance with the formation of the convex portions 3a, 4Aa, 4B'a, 5a, and 6Aa in the first etching step. In the embodiment, a material for forming the insulator 33, the material being formed of an insulating inorganic material initially having fluidity at room temperature, is filled in the recess and then baked, so that the insulator 33 is hardened (Step S3 of FIG. 2).

When the insulator 33 which is hardened by baking is used like the embodiment, it is preferable to use a material having a relatively low baking temperature for the insulator 33 so that the property of the metal plate sheet 2A is not deteriorated by baking.

Figure 3D:
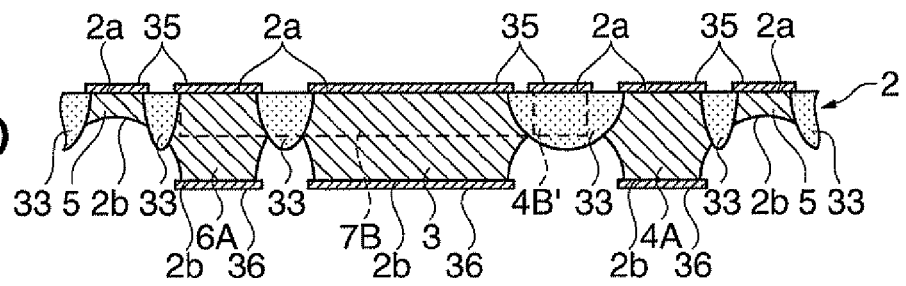

Next as shown in FIG. 3D, second etching is performed in which the metal plate sheet 2A is partially etched from the second face 2b so as to be in communication with the recess to form the plurality of metal posts extending from the convex portions 3, 4A, 4B'a, 5, and 6A to the second face 2b. Thus, the substrates 2 of the plurality of sensor devices 1 which are arranged in an array in plan view in the metal plate sheet 2A are formed (Step S4 of FIG. 2).

The second etching step is performed using, as an etching mask, the etching mask pattern formed using the second plated layer 36 which is formed on the second face 2b of the metal plate sheet 2A simultaneously with the etching mask pattern for forming the convex portions, the etching mask pattern being formed using the first plated layer 35 of the first face 2a in the plating and patterning step described above. Through the second etching step, the cylindrical third metal post 5; the plurality of metal posts which are disposed so as to be surrounded by the third metal post 5, held integrally with the insulator 33, and electrically independent of each other, that is, the first metal post 3, the second metal posts 4A and 4B', and the fourth metal post 6A; and the metal wiring portion 7B which electrically connects the second metal post 4B' with the fourth metal post 6A are formed.

In this case, since the etching mask pattern formed using the second plated layer 36 is not formed on the second faces 2b of the third metal post 5 and the metal wiring portion 7B, the second faces 2b of the third metal post 5 and the metal wiring portion 7B are etched closer to the side of the first face 2a than the second faces 2b of the other metal posts as described above.

Figure 4A:
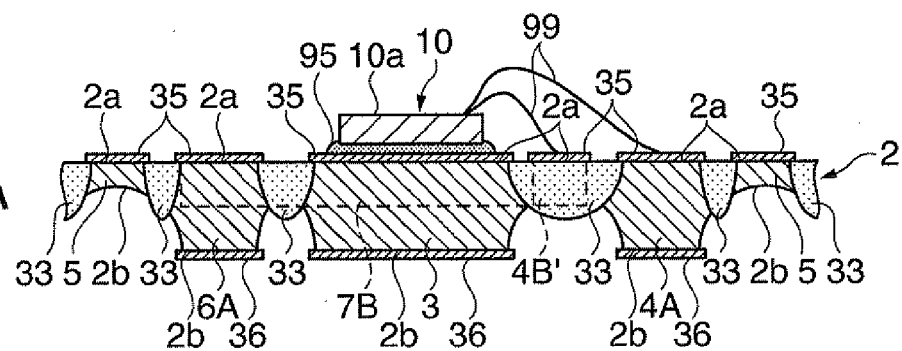
FIGS. 4A to 4C are front cross-sectional views each schematically explaining a form in each step in the method for manufacturing the sensor device.

Next as shown in FIG. 4A, IC die attach as a semiconductor circuit element bonding step is performed in which a face of the IC chip 10, the face being opposite the active face 10a having the electrode pads 11, is faced to the first face 2a of the first metal post 3 and bonded thereto with a bonding member 95 such as a die attach material (Step S5 of FIG. 2). Then, wire bonding as a bonding step is performed in which the plurality of electrode pads 11 and the second metal posts 4A and 4B' corresponding to the electrode pads are electrically connected with the bonding wires 99 as conductive members (Step S6 of FIG. 2).

Figure 4B:
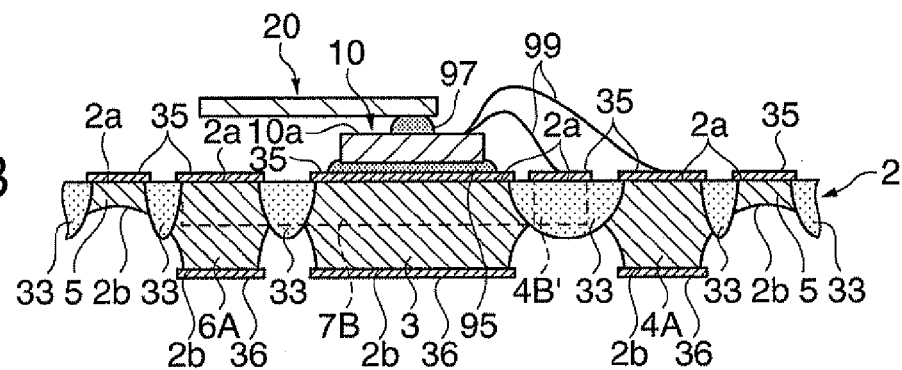

Next as shown in FIG. 4B, connection of the sensor element 20 as a vibrating reed connecting step is performed in which the sensor element 20 is electrically connected and fixed to the active face 10a of the IC chip 10. The electrical connection and fixation of the sensor element 20 are performed via the bonding member 97 such as a stud bump disposed on the not-shown mount electrode of the active face 10a of the IC chip 10. Thus, the sensor element 20 and the integrated circuit of the IC chip 10 are connected, and the sensor element 20 is held above the IC chip 10 in a state where a gap is disposed between the sensor element 20 and the IC chip 10 with the bonding member 97 (Step S7 of FIG. 2).

Next, frequency adjustment of the sensor element 20 which is bonded to the substrate 2 together with the IC chip 10 is performed (Step S8 of FIG. 2). The frequency adjustment can be performed by a method in which a part of an electrode of the sensor element 20 is removed by laser trimming to decrease the mass, a method of adding a mass to the sensor element 20, such as evaporation or sputtering, a method of rewriting data of the IC chip 10, or the like.

Figure 4C:
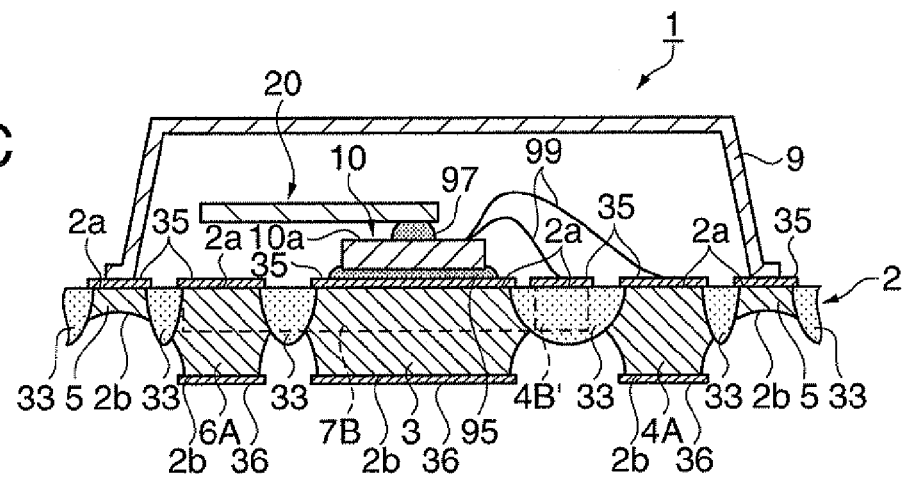

Next as shown in FIG. 4C, the lid 9 is bonded so as to cover the IC chip 10 and the sensor element 20 which are bonded above the substrate 2, to seal the IC chip 10 and the sensor element 20 in an inner space formed by the substrate 2 and the lid 9 (Step S9 of FIG. 2). Specifically, the lid 9 using a metal such as Kovar is bonded above the first face 2a of the cylindrical third metal post 5 of the substrate 2 by a bonding method such as seam welding via a seam ring or the like. In this case, sealing is performed while performing deaeration from the inner space to the outside, or sealing is performed while injecting an inert gas such as nitrogen ($N_2$) or argon (Ar), whereby stable vibration characteristics of the sensor element 20 are retained.

Thus, as shown in FIG. 5, the plurality of sensor devices 1 coupled in an array in plan view at regular intervals vertically and horizontally in the metal plate sheet 2A are formed.

Next, by dicing along cutting plane lines indicated by broken lines in FIG. 5, the plurality of sensor devices 1 formed in the metal plate sheet 2A are separated into individual pieces (Step S10 of FIG. 2).

Next, a characteristic inspection for inspecting exterior characteristics or electrical characteristics of the sensor device 1 is performed to sort out good pieces whose characteristics fall within standards from defective pieces whose characteristics fall outside the standards (Step S11 of FIG. 2), whereby the series of manufacturing steps of the sensor device 1 are finished.

According to the sensor device 1 manufactured by the manufacturing method, the substrate 2 on which the IC chip 10 and the sensor element 20 are mounted can be formed by performing an etching process on a metal plate using a well-known photolithographic technique. Thus, compared to a ceramic substrate or a ceramic package used as a substrate in a sensor device (vibrating device) in the past, a material used for a substrate is inexpensive and the design change of the IC chip or the sensor element can be dealt with only by changing a photolithographic photomask. Therefore, the sensor device 1 can be provided at low cost.

Moreover, the sensor device 1 of the embodiment is configured such that the one pair of second metal posts 4A' and 4B' of the two pairs of second metal posts which are connected to the electrode pads 11 of the IC chip 10 via the bonding wires are connected to the fourth metal posts 6A and 6B via the metal wiring portions 7A and 7B to achieve a connection to an external substrate through the second faces 2b of the fourth metal posts 6A and 6B.

In this manner, rearrangement wiring for rearranging the second metal posts 4A' and 4B' which are electrically connected to the electrode pad 11 of the IC chip 10 to the fourth metal posts 6A and 6B which achieve a connection to an external substrate via the metal wiring portions 7A and 7B is formed, whereby the change of arrangement of the electrode pad of the IC chip 10 or the design change of the external substrate can be dealt with relatively easily. This provides features that the plurality of metal posts include the fourth metal post, the metal wiring portion which electrically connects the second metal post with the fourth metal post is included, and that the second face of the metal wiring portion is located closer to the side of the first face than the second faces of the first metal post, the second metal post, and the fourth metal post.

Moreover, in the embodiment, the metal posts of the substrate 2 are formed by the first etching step in which a metal plate is etched from the side of the first face 2a using the first plated layer 35 as an etching mask and by the second etching step in which the metal plate is etched from the side of the second face 2b using the second plated layer 36 as an etching mask.

According to this configuration, the first plated layer 35 and the second plated layer 36 used as etching masks in the first etching step and the second etching step can be used as they are, in each of the metal posts, as contact metal in achieving an electrical connection with the IC chip 10 and the sensor element 20 or with an external substrate, which provides a remarkable effect on a reduction in cost of the sensor device 1.

Moreover, the sensor device 1 of the embodiment is configured such that the lid 9 using a metal is bonded to the first face 2a of the third metal post 5, while achieving an electrical connection, to seal the IC chip and the sensor element 20 which are bonded to the substrate 2.

Thus, the lid 9 bonded so as to cover the IC chip 10 and the sensor element 20 provides a shield effect, making it possible to avoid such troubles that the IC chip 10 malfunctions due to the influence of external electromagnetic waves and that unwanted electromagnetic waves of the IC chip 10 adversely affect on the outside.

The manufacturing method of the sensor device 1 of the embodiment adopts the method in which the plurality of substrates 2 are formed in an array in plan view in the metal plate sheet 2A, the IC chip 10 and the sensor element 20 are bonded to each of the substrates 2 and sealed with the lid 9, and thereafter the plurality of sensor devices 1 in individual pieces are collectively obtained by dicing.

Thus, manufacturing efficiency is improved, making it possible to remarkably reduce the manufacturing cost.

Second Embodiment

Hereinafter, a second embodiment of a sensor device will be described.

Figure 6:
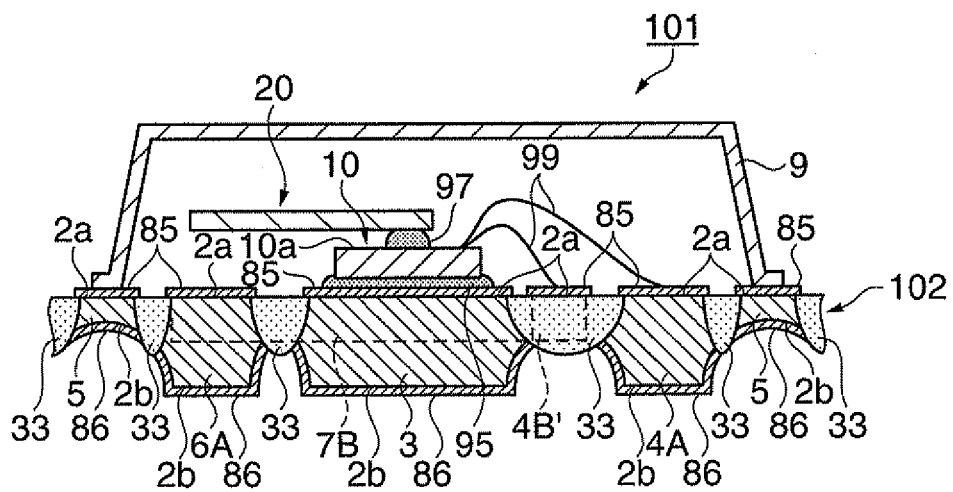
FIG. 6 is a schematic cross-sectional view showing a schematic configuration of a second embodiment of a sensor device.

FIG. 6 is a schematic view showing a schematic configuration of the second embodiment of the sensor device. The schematic view is a cross-sectional view showing the same section as that of FIG. 1B.

The sensor device of the second embodiment has the same configuration as that of the sensor device 1 of the first embodiment, other than plated layers formed on a first face and a second face of a substrate. Therefore, portions in common with those in the first embodiment are denoted by the same reference and numeral signs, and the description thereof is omitted.

In FIG. 6, the sensor device 101 of the second embodiment has a substrate 102 including a plurality of metal posts and the insulator 33 which integrally fixes the metal posts in a state of being electrically independent of each other, the IC chip 10 and the sensor element 20 which are mounted on the substrate 102, and the lid 9 which seals the IC chip 10 and the sensor element 20.

The substrate 102 formed by processing a metal plate has substantially the same configuration as that of the substrate 2 (refer to FIGS. 1A to 1C and FIGS. 3A to 4C) of the sensor device 1 of the first embodiment. That is, in the substrate 102, the first metal post 3, the two pair of second metal posts 4A and 4B', the fourth metal post 6A, and the metal wiring portion 7B which electrically connects the second metal post 4B' with the fourth metal post 6B respectively, and the cylindrical third metal post 5 which is arranged so as to surround in plan view the metal posts and the metal wiring portion are formed by being integrally fixed with the insulator 33.

A first plated layer 85 is formed on the first faces 2a of the metal posts and the metal wiring portion 7B. A second plated layer 86 is provided on the second faces 2b of the metal posts and the metal wiring portion 7B, and on faces different from the second faces 2b on the side of the second face 2b. In this case, the faces different from the second faces 2b on the side of the second face 2b mean etching faces formed in the second etching step in which etching is performed from the second face 2b. The faces are parts of side faces of the metal posts or the metal wiring portions 7A and 7B. In other words, all the first faces 2a exposed from the insulator 33 of the substrate 102 of the embodiment are covered with the first plated layer 85, and all exposed faces of the metal plate on the side of the second face 2b are provided with the second plated layer.

The IC chip 10 and the sensor element 20 are mounted on the substrate 102 having the configuration described above in the same form as that of the first embodiment, and the IC chip 10 and the sensor element are sealed in a space with a stable atmosphere by the lid 9.

In the sensor device 101 of the second embodiment, the second plated layer provided on the second faces 2b of the metal posts and the metal wiring portion 7B of the substrate 102 and on the faces different from the second faces 2b on the side of the second face 2b is formed by, in a later-described manufacturing method, an electroless plating method after forming the metal posts and the metal wiring portion 7B by etching from the second face 2b of the metal plate.

According to this configuration, since the first plated layer 85 or the second plated layer is formed on all the exposed faces of the metal plate of the substrate 102, corrosion resistance is improved compared to the case where the metal face of the metal plate is exposed.

Moreover, when the sensor device 101 is mounted on an external substrate by solder bonding for example, a bonding member such as solder wets and spreads not only on the second faces 2b of the metal posts but also to the side faces, making it possible to form a favorable fillet.

Accordingly, it is possible to provide the sensor device 101 with high connection reliability.

Next, a method for manufacturing the sensor device 101 of the second embodiment will be described according to the drawings.

Figure 7:
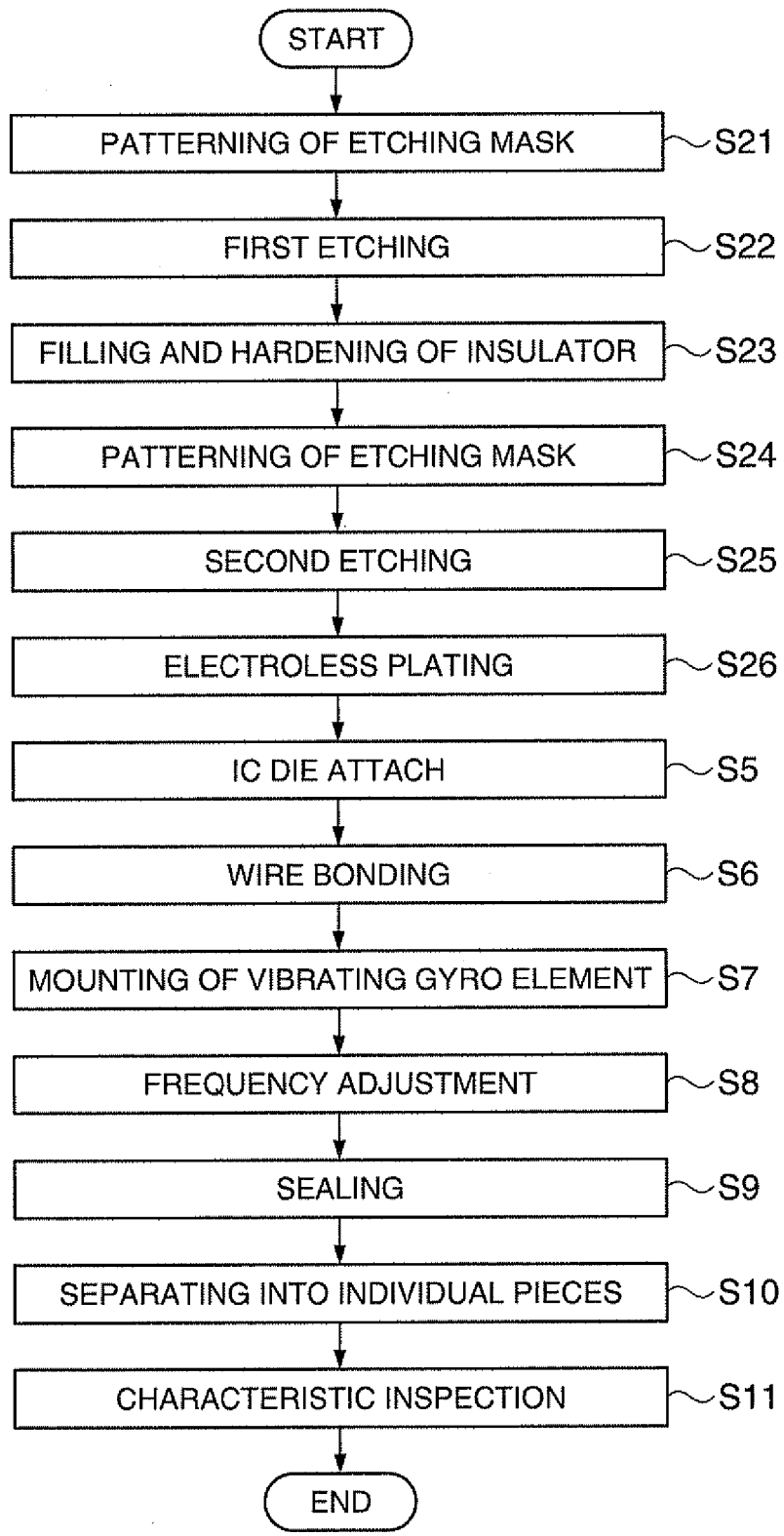
FIG. 7 is a flowchart showing a method for manufacturing the sensor device of the second embodiment.

FIG. 7 is a flowchart showing the method for manufacturing the sensor device of the second embodiment.

FIGS. 8A to 9C are front cross-sectional views each schematically explaining a form in each step in the method for manufacturing the sensor device of the second embodiment.

The sensor device 101 of the embodiment has the same configuration as that of the sensor device 1 of the first embodiment other than the substrate 102. Therefore, the same steps as those of the first embodiment are denoted by the same reference and numeral sings, and the description thereof is omitted. Moreover, in FIGS. 8A to 9C, only the manufacturing process of the substrate is shown.

Figure 8A:
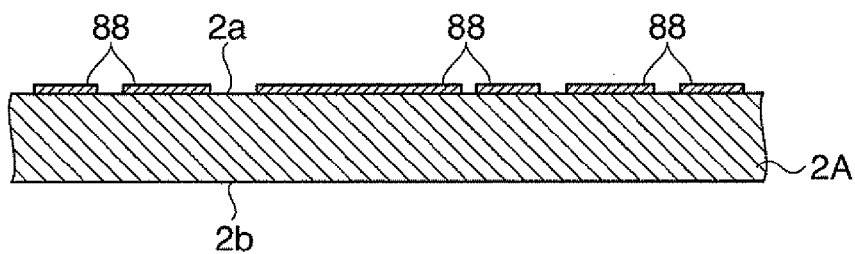
FIGS. 8A to 8D are front cross-sectional views each schematically explaining a form in each step in the method for manufacturing the sensor device of the second embodiment.

In the method for manufacturing the sensor device 1 of the second embodiment, a photoresist is first applied on the first face 2a of the metal plate sheet 2A as shown in FIG. 8A, and thereafter the photoresist is patterned, whereby an etching mask (photoresist pattern) for forming parts of the plurality of metal posts on the side of the first face 2a is formed (Step S21 of FIG. 7).

Figure 8B:
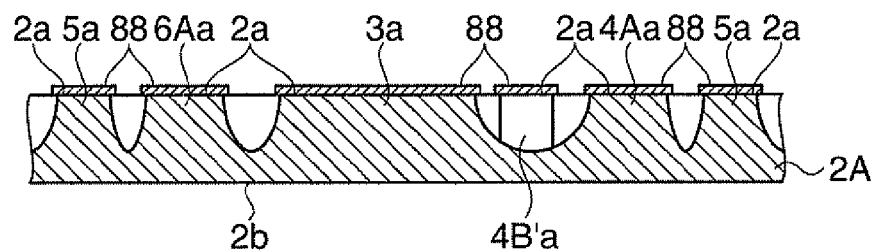

Next as shown in FIG. 8B, first etching is performed in which half-etching is performed from the first face 2a of the metal plate sheet 2A using the etching mask 88 to thereby form a plurality of convex portions 3a, 4Aa, 4B'a, 5a, and 6Aa serving as parts of the plurality of metal posts and the metal wiring portion 7B (and 7A) (Step S22 of FIG. 7).

Figure 8C:
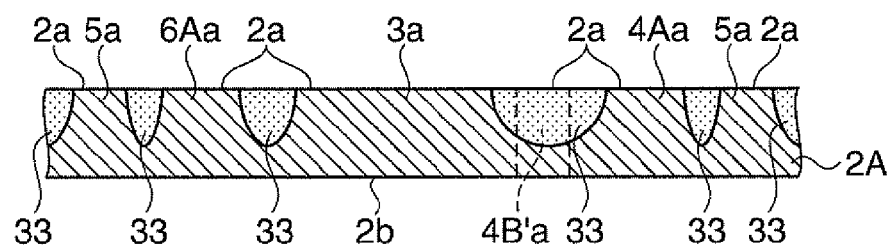

Next as shown in FIG. 8C, insulator formation is performed in which the insulator 33 is filled and hardened in a recess formed in accordance with the formation of the convex portions 3a, 4Aa, 4B'a, 5a, and 6Aa in the first etching step (Step S23 of FIG. 2).

Figure 8D:
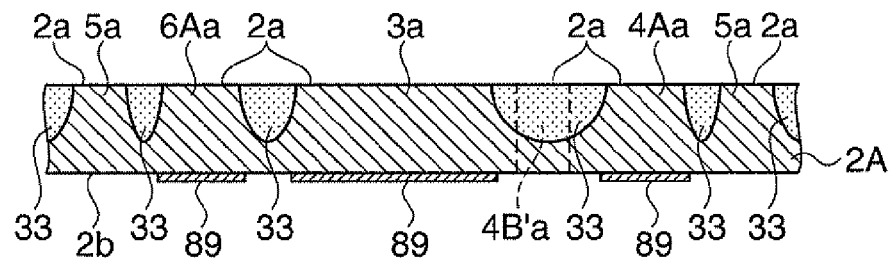

Next as shown in FIG. 8D, a photoresist is applied on the second face 2b of the metal plate sheet 2A, and thereafter the photoresist is patterned, whereby an etching mask 89 for forming parts of the plurality of metal posts on the side of the second face 2b is formed (Step S24 of FIG. 7).

Figure 9A:
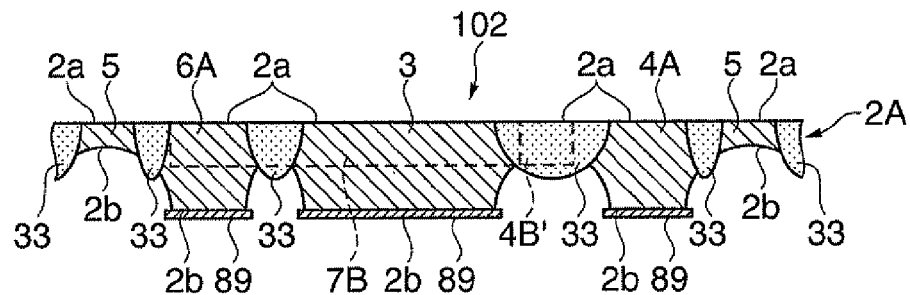
FIGS. 9A to 9C are front cross-sectional views each schematically explaining a form in each step in the method for manufacturing the sensor device of the second embodiment.
Figure 9B:
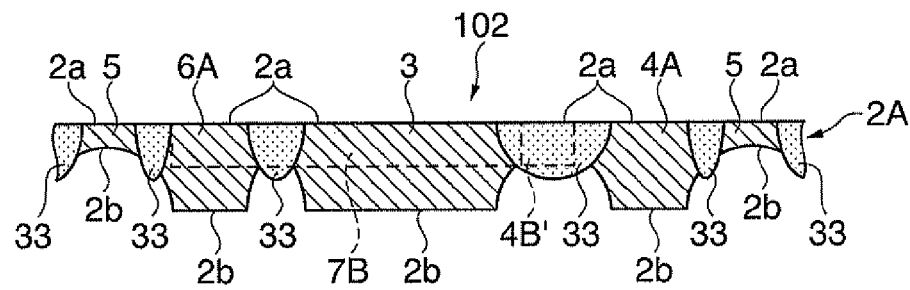

Next as shown in FIG. 9A, second etching is performed in which the metal plate sheet 2A is half-etched using the etching mask 89 from the second face 2b so as to be in communication with the recess to thereby form the plurality of metal posts extending from the convex portions to the second face 2b (Step S25 of FIG. 7).

Figure 9C:
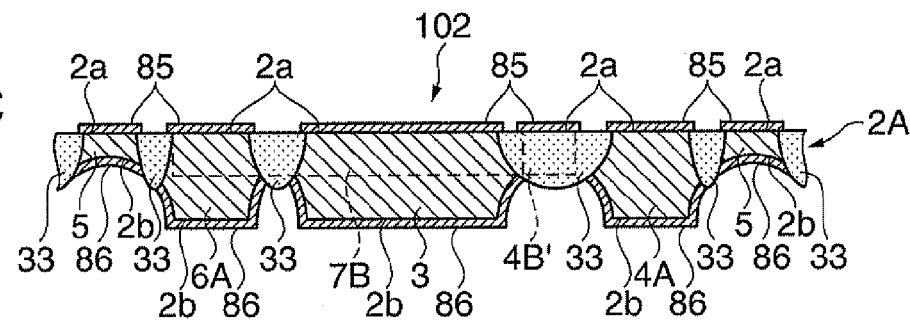

Next, the etching mask 89 is peeled from the metal plate sheet 2A in which the outer shape of a plurality of substrates 102 is formed through the steps described above (refer to FIG. 9B), and then electroless plating is performed by immersion in an electroless plating solution, whereby the second plated layer 86 is formed on exposed metal faces. Thus, as shown in FIG. 9C, the first plated layer 85 is formed on the first faces 2a of the metal posts and the metal wiring portions of the substrate 102, and the second plated layer 86 is formed on the second faces 2b and the faces different from the second faces 2b on the side of the second face 2b.

Through the steps described above, the plurality of substrates 102 coupled in an array in plan view in the metal plate sheet 2A are formed (Step S26 of FIG. 7).

Using the substrates 102 formed as described above, it is possible to manufacture the sensor device 101 in which the IC chip 10 and the sensor element 20 which are mounted on the substrate 102 are airtightly sealed with the lid 9 through the steps of Step S5 to S11 shown in FIG. 7, similarly to the method for manufacturing the sensor device 1 of the first embodiment (refer to FIG. 2 to FIG. 5).

The sensor device described in the embodiment can be implemented as a modified example described below.

Modified Example

Hereinafter, a modified example of a sensor device will be described with reference to the drawings.

Figure 10A:
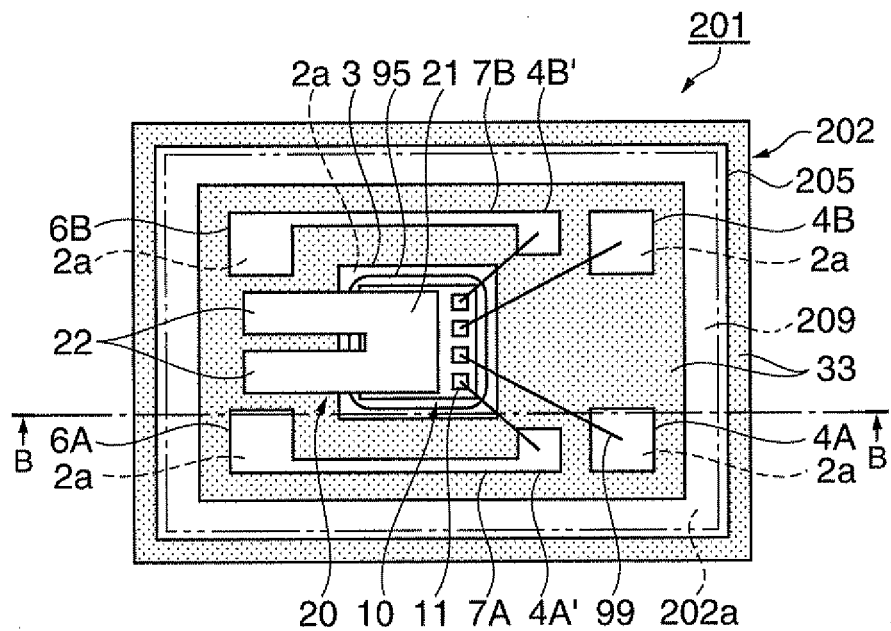
Figure 10B:
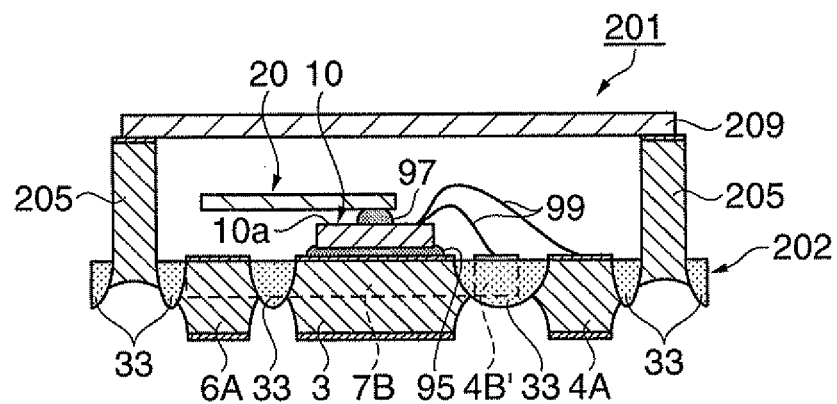

FIGS. 10A and 10B are schematic views showing a schematic configuration of the modified example of the sensor device, in which FIG. 10A is a plan view viewed from the side (upper side) of an IC chip and FIG. 10B is a cross-sectional view along line B-B of FIG. 10A. Portions in common with those of the embodiment are denoted by the same reference and numeral signs, and the description thereof is omitted. Configurations different from the embodiment will be mainly described.

The sensor device 201 of the modified example shown in FIGS. 10A and 10B has a substrate 202 including a plurality of metal posts and the insulator 33 which integrally fixes the metal posts in a state of being electrically independent of each other, the IC chip 10 and the sensor element 20 which are mounted on the substrate 202, and a plate-like lid 209 which seals the IC chip 10 and the sensor element 20.

The substrate 202 formed by processing a metal plate has a plurality of metal posts having substantially the same configuration as that of the substrate 2 (refer to FIGS. 1A to 1C and FIGS. 3A to 4C) of the sensor device 1 of the first embodiment. That is, in the substrate 202, the first metal post 3, the two pairs of second metal posts 4A, 4B, 4A', and 4B', the fourth metal posts 6A and 6B, the metal wiring portions 7A and 7B which electrically connect the second metal posts 4A' and 4B' with the fourth metal posts 6A and 6B, respectively, and a cylindrical third metal post 205 which is arranged so as to surround in plan view the metal posts and the metal wiring portions are formed by being integrally fixed with the insulator 33.

In the substrate 202 having the configuration, a first face 202a of the cylindrical third metal post 205 is located higher than the first faces 2a of the other metal posts. More specifically, the first face 202a of the third metal post 205 is located higher than the IC chip 10 and the sensor element 20 which are mounted on the first face 2a of the first metal post 3.

For forming the substrate 202 having the configuration described above, in the manufacturing steps (refer to FIGS. 3A to 4C) of the substrate of the manufacturing method of the sensor device described in the embodiment, a metal plate is first half-etched by masking a region serving as the first face 202a of the third metal post 205, before forming the parts (convex portions) of the metal posts on the side of the first face 2a in the first etching step, to thereby form an upper cylindrical wall of the third metal post 205. Thereafter, the substrate 202 is formed according to the manufacturing method of the sensor device of the embodiment, and the IC chip 10 and the sensor element 20 are mounted on the substrate 202 in the same form as that of the first embodiment. Then, the plate-like lid 209 is bonded to the first face 202a of the third metal post 205 to seal the IC chip 10 and the sensor element, whereby the sensor device 201 of the modified example can be manufactured.

According to the configuration, since the IC chip 10 and the sensor element 20 which are mounted on the first metal post 3, or connecting members such as the bonding wires 99 as conductive members which electrically connect the IC chip 10 with the second metal posts 4A, 4B, 4A', and 4B' can be surrounded by the third metal post 205, the substrate 202 having a form like a package in the past can be configured. That is, the IC chip 10 and the sensor element 20 which are mounted on the substrate 202 can be sealed with the plate-like lid 209.

Moreover, the IC chip 10 and the sensor element 20 are surrounded by the third metal post 205, whereby the third metal post 205 can provide a shield effect to block electromagnetic waves. Therefore, it is possible to avoid malfunction of the IC chip or the like due to the influence of external electromagnetic waves, or an adverse influence on the outside exerted by unwanted electromagnetic waves of the IC chip 10.

In the configuration, by using a metal for the lid 209 or by configuring the lid with a metal layer, a shield effect can be obtained more remarkably.

Third Embodiment

Electronic Apparatus

An electronic apparatus on which the sensor device described in the embodiments and the modified example is mounted can reduce the cost and improve reliability.

Figure 11A:
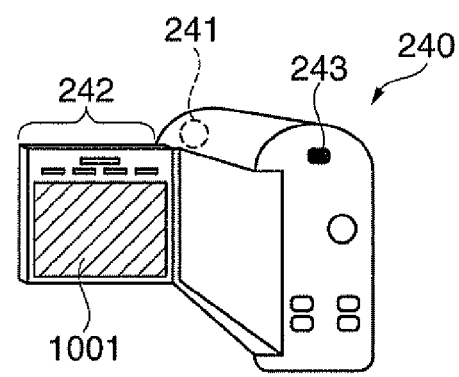

For example, FIG. 11A shows an example applied to a digital video camera. A digital video camera 240 includes an image receiving section 241, an operating section 242, a sound input section 243, and a display unit 1001. By mounting, on the digital video camera 240, a sensor including the sensor device 1 of the embodiment, the digital video camera can be equipped with a so-called image stabilization function.

Figure 11B:
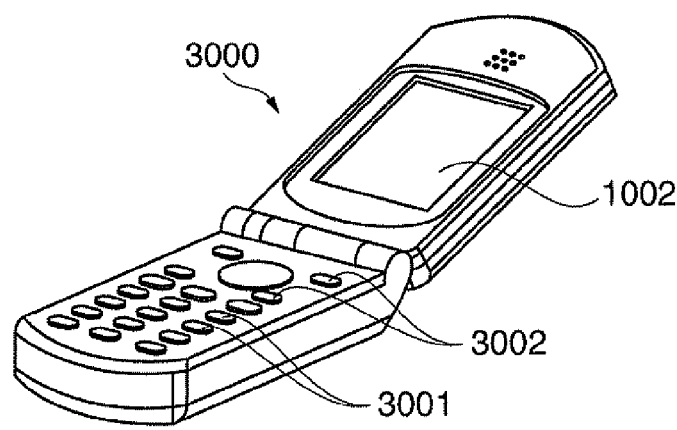
Figure 11C:
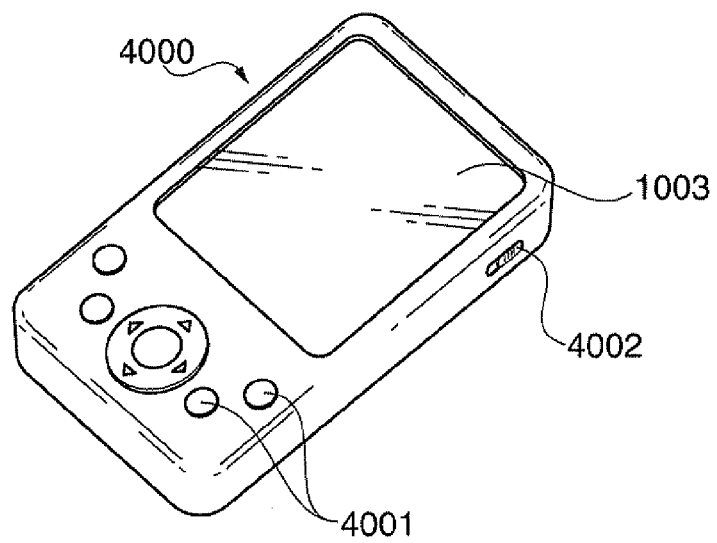

FIG. 11B shows an example applied to a mobile phone as an electronic apparatus. FIG. 11C shows an example applied to a personal digital assistant (PDA) as an electronic apparatus.

A mobile phone 3000 shown in FIG. 11B includes a plurality of operation buttons 3001, a plurality of scroll buttons 3002, and a display unit 1002. By operating the scroll buttons 3002, a screen displayed on the display unit 1002 is scrolled.

A PDA 4000 shown in FIG. 11C includes a plurality of operation buttons 4001, a power switch 4002, and a display unit 1003. When the power switch 4002 is operated, various types of information such as an address book or a schedule note are displayed on the display unit 1003.

By mounting the sensor device of the embodiment on the mobile phone 3000 or the PDA 4000, various functions can be given. For example, when a not-shown camera function is given to the mobile phone 3000 of FIG. 11B, image stabilization can be performed by using a gyro sensor as a sensor device to be mounted on the mobile phone 3000. Moreover, when the mobile phone 3000 of FIG. 11B or the PDA 4000 of FIG. 11C is provided with a global positioning system widely known as GPS, the position or posture of the mobile phone 3000 or the PDA 4000 can be recognized in GPS by mounting the sensor device of the embodiment.

Since these electronic apparatuses use the sensor device of the embodiments and the modified example, a reduction in cost and improvement in reliability can be achieved.

Examples of electronic apparatus to which the sensor device and the motion sensor according to the invention can be applied are not limited to the electronic apparatuses shown in FIGS. 11A to 11C and include mobile computers, car navigation systems, electronic notebooks, calculators, workstations, videophones, POS terminals, and game machines.

Although the embodiments of the invention made by the present inventor have been specifically described above, the invention is not limited to the embodiments and the modified example, and various modifications can be added within a range not departing from the gist thereof.

For example, in the embodiment, the configuration has been described in which rearrangement wiring for rearranging the second metal posts 4A' and 4B' which are electrically connected to the electrode pads 11 of the IC chip 10 to the fourth metal posts 6A and 6B which achieve a connection to an external substrate via the metal wiring portions 7A and 7B is formed and the electrode pads 11 and the external substrate are connected via the fourth metal posts 6A and 6B.

This is not restrictive. For example, the electrode pads 11 extracted from a data-writable circuit element of the integrated circuit of the IC chip 10 are connected to the second metal posts with conductive members (the bonding wires 99), and the fourth metal posts connected to the second metal posts with the metal wiring portions can be used as writing terminals for user. In this case, the use as the writing terminal is not limited to the second face of the fourth metal post. For example, a part of the third metal post arranged so as to surround the plurality of metal posts is allowed to be electrically independent by an etching process and fixing with an insulator, and a writing terminal for user is arranged on the part of the third metal post, that is, on a side face of the sensor device, whereby the writing terminal can be provided.

In the manufacturing method of the sensor device 101 of the second embodiment, the configuration is adopted in which the first etching is performed by using the etching mask 88 formed by patterning a photoresist and electroless plating is performed on the entire surface after the second etching, whereby the first plated layer 35 and the second plated layer 36 are formed simultaneously.

This is not restrictive. A configuration may be adopted in which the first plated layer 35 is used as an etching mask in the first etching similarly to the first embodiment and the second plated layer is formed by an electroless plating method only on the side of the second face 2b of a metal plate after the second etching.

In the embodiments and the modified example, although the example using quartz crystal as a material for forming the sensor element as a vibrating reed has been described, a piezoelectric material other than quartz crystal can be used. For example, aluminum nitride (AlN); an oxide substrate such as of lithium niobate ($LiNbO_3$), lithium tantalate ($LiTaO_3$), lead zirconate titanate (PZT), lithium tetraborate ($Li_2B_4O_7$), or langasite ($La_3Ga_5SiO_{14}$); a laminated piezoelectric substrate configured by laminating a piezoelectric material such as aluminum nitride or tantalum pentoxide ($Ta_2O_5$) on a glass substrate; or piezoelectric ceramics such as of lead titanate zirconate ($Pb(Zr_x, Ti_{1-x})O_3$) can be used.

Moreover, a vibrating reed can be formed using a material other than a piezoelectric material. For example, a vibrating element can be formed also by using a silicon semiconductor material or the like.

The exciting method of driving vibrations or the detecting method of detection vibrations of a vibrating element is not limited to those by a piezoelectric effect. Also in an electrostatically-driven vibrating reed using an electrostatic force (the Coulomb force), a Lorentz driven vibrating reed using a magnetic force, and the like, the configurations of the invention and the effects thereof can be exerted.

The shape of a sensor element as a vibrating reed is not limited to the tuning-fork type like the sensor element 20 described in the embodiments and the modified example. A beam-shaped vibrating reed including one vibrating portion extending from a supporting portion or a vibrating reed including three or more vibrating portions is also available. Alternatively, also in a vibrating reed which performs electrostatic detection with interdigital electrodes like a MEMS gyro element, effects similar to those described in the embodiments and the modified example can be obtained according to a configuration using the substrate according to the invention.

For the sensor element 20 as a vibrating reed included in a sensor device, various sensing elements such as, for example, an angular velocity sensing element, an acceleration sensing element responding to acceleration, a pressure sensing element responding to pressure, and a weight sensing element responding to weight can be used.

Accordingly, a sensor using the sensor device according to the invention can be used as a gyro sensor which detects angular velocity or a sensor which detects various physical quantities such as angular acceleration, acceleration, force, temperature, or magnetic field.

A vibrating reed used for the sensor device (vibrating device) according to the invention is not limited to the sensor element 20 described in the embodiments and the modified example and may be a resonator, for example. With the use of the resonator, an oscillator as a vibrating device may be configured.

What is claimed is:

1. A vibrating device comprising:
    a substrate including a plurality of metal posts and an insulator, the plurality of metal posts each having a first face and a second face opposite the first face, the plurality of metal posts including a first metal post and a second metal post, the insulator being filled in a gap between faces of the plurality of metal posts and integrally fixing the plurality of metal posts, the faces being different from the first face and the second face;
    a semiconductor circuit element having an electrode on a third face and fixed to the first metal post with a fourth face facing the first face of the first metal post, the fourth face being opposite the third face;
    a vibrating reed having a supporting portion and a vibrating portion extended from the supporting portion, the vibrating reed being supported by the semiconductor circuit element by bonding the supporting portion to the third face of the semiconductor circuit element;
    a conductive member electrically connecting the electrode with the second metal post; and
    a lid disposed so as to cover the semiconductor circuit element and the vibrating reed.

2. The vibrating device according to claim 1, wherein
    the plurality of metal posts include a cylindrical third metal post arranged so as to surround in plan view the first metal post and the second metal post,
    the insulator is filled on the side of an inner wall face of the third metal post,
    the lid is bonded to the first face of the third metal post, and
    a distance between the first face and the second face of the third metal post is shorter than a distance between the first face and the second face of the first metal post and the second metal post.

3. The vibrating device according to claim 1, wherein
    the plurality of metal posts include a fourth metal post and a metal wiring portion,
    the metal wiring portion electrically connects the second metal post with the fourth metal post, and
    a distance between the first face and the second face of the metal wiring portion is shorter than a distance between the first face and the second face of the first metal post, the second metal post, and the fourth metal post.

4. The vibrating device according to claim 1, further comprising a first plated layer on the first faces of the plurality of metal posts, wherein
    the first plated layer protrudes outwardly from the first face.

5. The vibrating device according to claim 1, further comprising a second plated layer on the second faces of the metal posts and on a face different from the second faces on the side of the second face.

6. The vibrating device according to claim 2, wherein
    the first face of the third metal post is located at a higher position than the first faces of the other metal posts.

7. The vibrating device according to claim 6, wherein
    the first face of the third metal post is located at a higher position than the vibrating reed.

8. The vibrating device according to claim 1, wherein
    the lid includes a metal portion, and
    the lid is electrically connected with the third metal post.

9. An electronic apparatus comprising the vibrating device according to claim 1.

* * * * *